US010402525B1

(12) United States Patent
Li et al.

(10) Patent No.: US 10,402,525 B1
(45) Date of Patent: Sep. 3, 2019

(54) METHODS, SYSTEMS, AND ARTICLES OF MANUFACTURE FOR IMPLEMENTING AN ELECTRONIC DESIGN WITH TRANSISTOR LEVEL SATISFIABILITY MODELS

(71) Applicant: Cadence Design Systems, Inc., San Jose, CA (US)

(72) Inventors: Nan Li, Beijing (CN); Hing Key Kenneth Tseng, Beijing (CN); Shupeng Cui, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 364 days.

(21) Appl. No.: 15/199,854

(22) Filed: Jun. 30, 2016

(51) Int. Cl.
*G06F 17/50* (2006.01)

(52) U.S. Cl.
CPC ...... *G06F 17/5045* (2013.01); *G06F 17/5022* (2013.01); *G06F 17/5031* (2013.01)

(58) Field of Classification Search
CPC ............. G06F 17/5045; G06F 17/5022; G06F 17/5031
See application file for complete search history.

(56) References Cited

U.S. PATENT DOCUMENTS

| | | | | |
|---|---|---|---|---|
| 5,946,475 A * | 8/1999 | Burks | ................. | G06F 17/5022 716/108 |
| 7,299,431 B2 * | 11/2007 | Teene | ................. | G06F 17/5022 703/14 |
| 7,818,158 B2 * | 10/2010 | McDonald | ............ | G06F 17/504 703/14 |
| 8,341,567 B1 * | 12/2012 | Tiwary | ................. | G06F 17/504 716/106 |
| 8,655,634 B2 * | 2/2014 | Hathaway | ............ | G06F 17/5036 703/14 |

OTHER PUBLICATIONS

"Applications of Boolean Satisfiability to Verification and Testing of Switch-Level Circuits", by M. Favalli, M. Dalpasso, @Springer Science+Business Media New York Feb. 28, 2014.*

(Continued)

*Primary Examiner* — Nha T Nguyen
(74) *Attorney, Agent, or Firm* — Vista IP Law Group, LLP

(57) ABSTRACT

The described techniques implement an electronic design with transistor level satisfiability models by identifying a plurality of channel connected components of an electronic design for sensitization. These techniques further determine a set of transistor level satisfiability (SAT) models for the plurality of channel connected components of the electronic design and transform the plurality of channel connected components into a set of conjunctive normal form (CNF) formulae using at least the set of transistor level SAT models. The plurality of channel connected components of the electronic design may be sensitized at least by determining one or more satisfying assignments with the set of CNF formulae. These techniques may also generate transistor level satisfiability (SAT) logic models and transistor level SAT state models for a circuit component based in part or in whole upon design specifications and one or more characteristics of the circuit component.

20 Claims, 14 Drawing Sheets

(56) References Cited

OTHER PUBLICATIONS

Strunz, B. "Design for Testability in Digital Integrated circuits [Electronic resource]." Mode of access: http://www.cs.colostate.edu/~cs530/digital_testing.pdf.—Date of access Jan. 2015.

Visweswariah, C. "IBM Research Report: Electrical and Timing Simulation" (May 21, 1998).

Gomes, Carla P., et al. "Satisfiability solvers." Foundations of Artificial Intelligence Mar. 2008: 89-134.

Favalli, Michele, and Marcello Dalpasso. "Applications of boolean satisfiability to verification and testing of switch-level circuits." Journal of Electronic Testing 30.1 (2014): 41-55.

Rakheja, S. et al. "Critical false-path analysis through sensitization methods" (Dec. 29, 2010).

* cited by examiner

METHODS, SYSTEMS, AND ARTICLES OF MANUFACTURE FOR IMPLEMENTING AN ELECTRONIC DESIGN WITH TRANSISTOR LEVEL SATISFIABILITY MODELS

BACKGROUND

Switch-level analyses on conventional MOS (metal-oxide-semiconductor) often partition an electronic design into a netlist including multiple channel-connected components, construct a reduced order binary decision diagram (ROBDD or simply BDD), and traverse the ROBDD to obtain DC (direct current) or steady-state vectors based on the switch-graph theory. The transistor paths (e.g., a path from an output node to a voltage source Vdd or the ground GND) are then examined to determine the states of the nodes by providing these DC vectors to a simulator to determine switch vectors to sensitize or verify whether the electronic design switches as indicated by these switch vectors.

The size of channel-connected components in modern electronic designs in the past year or two has grown exponentially to have a channel-connected component having more than one hundred (100) MOS transistors or structures. The resulting ROBDDs often include hundreds of thousands of nodes. Sensitizing transistor paths in such an electronic design thus has taken a prohibitively expensive amount of time, especially during the simulation of the DC vectors to obtain the switch vectors.

To further exacerbate the prohibitively long runtime during the simulation stage, such switch-level simulations often assume that a MOS transistor is unidirectional with respect to its gate. That is, these simulations often assume that the voltage at a gate node of a MOS transistor causes some voltage change at the source or drain node, yet the voltages at the source and drain nodes are assumed to have no effect on the voltage of the gate node.

In satisfiability problems, an electronic circuit is often modeled with CNF (conjunctive normal form) formulae. Conventional approaches model an electronic design with CNF at the gate level. Unfortunately, the characteristics (e.g., the bi-directional characteristic) of MOS transistors cannot be successfully modeled and solved at the gate level.

Therefore, there exists a need for a method and a system for implementing an electronic design with transistor-level satisfiability models without having the aforementioned issues, disadvantages, or problems. The advantages of the various embodiments described herein are numerous. Most notably, the methods and systems described herein implement an electronic design with conjunctive normal forms at the transistor level and determine the switch vectors without pre-computing the DC vectors, constructing and traversing a binary decision diagram, or determining switch vectors by performing simulations with the DC vectors.

SUMMARY

Disclosed are method(s), system(s), and article(s) of manufacture for implementing an electronic design with transistor-level satisfiability models in one or more embodiments. Some embodiments are directed at a method for implementing an electronic design with transistor-level satisfiability models. In some embodiments, the method identifies a plurality of channel connected components (CCC) of an electronic design for sensitization. A set of transistor level satisfiability (SAT) models may be determined for the plurality of channel connected components of the electronic design. The plurality of channel connected components may then be transformed into a set of conjunctive normal form (CNF) formulae using at least the set of transistor level SAT models. The plurality of channel connected components of the electronic design may then be sensitized at least by determining one or more satisfying assignments with the set of CNF formulae.

In some embodiments, a CCC partition module that is stored at least partially in memory may partition the electronic design into the plurality of channel connected components. In some embodiments, a channel connected component may be identified from the plurality of channel connected components of the electronic design; and at least one circuit component may also be identified in the channel connected component. The at least one circuit component may be represented as one or more satisfiability models that are retrieved or derived from the set of satisfiability models.

In some of the preceding embodiments, at least one wire connecting multiple circuit components in the channel connected component may be identified. A transistor level SAT logic model may be determined for the at least one wire in the channel connected component; and a wire state resolution SAT state model may be generated with the transistor level SAT logic model for the at least one wire. To prevent or avoid loops in the electronic design, a loop topology comprising a plurality of circuit components may be identified in the channel connected component; and the loop topology may be represented with at least two loop detection SAT state models that improve accuracy of sensitizing the channel connected component.

Some embodiments directly determine switch vectors without pre-computing the DC vectors and without performing simulations with the pre-computed DC vectors to determine the switch vectors. In these embodiments, a switching requirement for a first circuit component may be identified in the channel connected component. A set of pre-switch SAT models and a set of post-switch SAT models may be identified for the first circuit component; and the set of pre-switch SAT models and the set of post-switch SAT models may be integrated into an SAT switch model for the first circuit component.

In some of the preceding embodiments, one or more transistor level pre-switch SAT logic models may be determined for the first circuit component; and the one or more transistor level pre-switch SAT logic models may be identified into the SAT switch model for the first circuit component. In addition, one or more transistor level post-switch SAT logic models may also be determined for the first circuit component; and the one or more transistor level post-switch SAT logic models may further be identified into the SAT switch model for the first circuit component. Moreover, one or more transistor level post-switch SAT state models may be determined for the first circuit component; and the one or more transistor level post-switch SAT state models may be identified into the SAT switch model for the first circuit component.

Some embodiments simplify the SAT models or the CNF formulae by introducing one or more new variables for a block. In these embodiments, a block comprising multiple circuit components may be identified in the electronic design. For this identified block, one or more new variables reflecting one or more states or values of the electronic design may be determined; and a local transformation may be performed on the block to convert the block into at least one conjunctive normal form formula. These embodiments apply the techniques described herein to a block including multiple circuit components to generate SAT models and conjunctive normal forms, while the other embodiments apply these techniques to an individual circuit component.

Some embodiments are directed at a method for implementing a transistor level satisfiability model. In these embodiments, a circuit component and a plurality of terminals of the circuit component may be identified at a transistor level in an electronic design. A plurality of wires respectively connected to the plurality of terminals as well as design specifications and one or more characteristics of the circuit component may also be identified for the electronic design. One or more transistor level satisfiability (SAT) logic models and one or more transistor level SAT state models may be generated for the circuit component based in part or in whole upon the design specifications and the one or more characteristics of the circuit component. In some of the preceding embodiments, a plurality of logic variables may be identified for the plurality of wires. A plurality of transistor level SAT wire logic models may be determined with the plurality of logic variables for the plurality of wires. The plurality of wires may then be represented with the plurality of transistor level SAT wire logic models.

In some embodiments, a directionality variable a plurality of state variables for the plurality of terminals may be identified for the circuit component. One or more transistor level SAT state models may be determined or constructed with the directionality variables and the plurality of state variables based in part or in whole upon the design specifications and one or more characteristics of the circuit component in the electronic design. The circuit component may then be represented with the plurality of transistor level SAT wire logic models and the one or more transistor level SAT state models.

In some of the preceding embodiments, a switching constraint for the circuit component. One or more pre-switch SAT logic models, one or more post-switch SAT logic models, and one or more post-switch SAT state models may be determined for the circuit component. A transistor level SAT switch model may then be constructed for the circuit component at least by integrating the one or more pre-switch SAT logic models, the one or more post-switch SAT logic models, and the one or more post-switch SAT state models for the circuit component.

The SAT switch model may be transformed into a set of conjunctive normal (CNF) form formulae, and an SAT solver module that is stored at least partially in memory may generate one or more switch vectors for the circuit component at least by determining one or more satisfying assignments that satisfy the set of CNF formulae. In some of these embodiments, the SAT solver module may directly determine the switch vectors, without traverse a data structure to pre-compute the DC vectors and without performing simulations with the pre-computed DC vectors to determine the switch vectors.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1A:
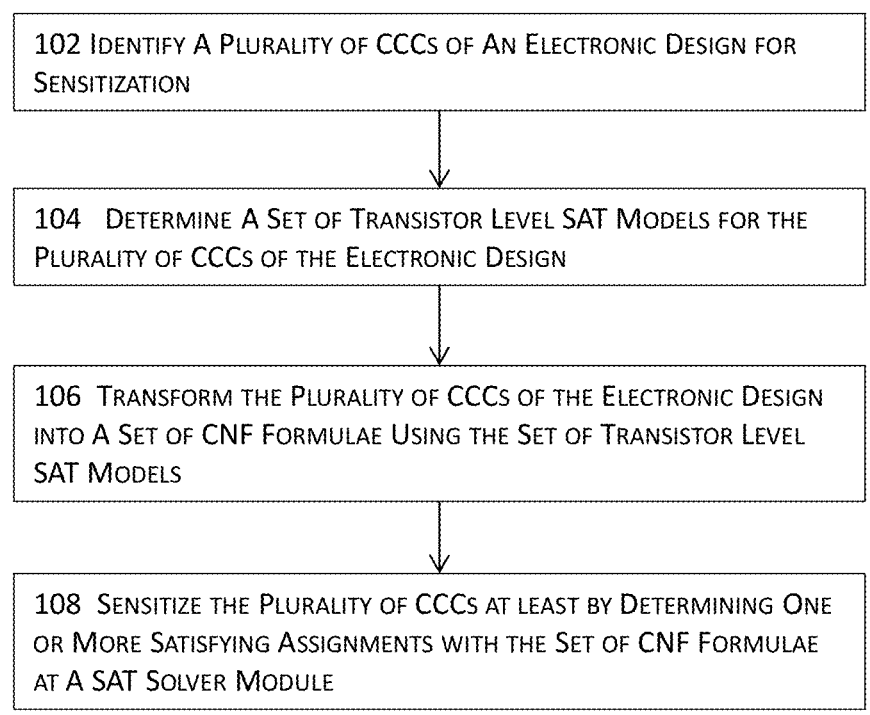
FIG. 1A illustrates a high level block diagram for a method or system for implementing an electronic design with transistor-level satisfiability models in some embodiments.

Various embodiments of the invention are directed to a methods, systems, and articles of manufacture for implementing an electronic design with transistor-level satisfiability models. Other objects, features, and advantages of the invention are described in the detailed description, figures, and claims.

Various embodiments are directed at implementing an electronic design with transistor-level satisfiability models. An electronic design of interest may be first partitioned into a plurality of channel connected components. A channel connected component (CCC) includes a circuit component having a set of transistors connected by their drain and source terminals. Any partitioning algorithms or mechanisms may be used to partition an electronic design into channel connected components. A set of transistor level satisfiability (SAT) models may be identified from existing transistor level satisfiability models or determined anew for the electronic design of interest or a portion thereof. The plurality of channel connected components may be transformed and hence modeled into a set of conjunctive normal form (CNF) clauses or formulae by using, for example, the Tseitin transformation (also known as Tseytin transformation) or other similar transformations.

Each CNF clause or formula includes one or more variables (e.g., wires, states of circuit components, etc.) representing one or more characteristics of a portion of the electronic design and represents a constraint that is to be satisfied by a corresponding portion of the electronic design. This set of CNF clauses or formulae may be conjoined to represent the satisfiability problem or the circuit satisfiability (CircuitSAT) problem of the electronic design. The satisfiability problem or the circuit satisfiability problem may be solved by a SAT solver to directly compute switch vectors without performing any simulations, and thus the plurality of channel connected components may be sensitized at least by determining one or more satisfying assignments, each having a plurality of values corresponding to a plurality of variables, for the set of CNF clauses or formulae.

One of the advantages of implementing an electronic design with transistor-level satisfiability models is that these techniques described herein model the electronic design with transistor level, rather than gate-level, SAT models and determine a set of CNF formulae or clauses that are subsequently conjoined to represent an electronic design of interest. Another advantage is that the set of CNF formulae or clauses may then be solved by a more efficient satisfiability solver, and that no simulations are required or performed in some embodiments. Various tests have demonstrated that these techniques have successfully reduced the runtime of about an hour for an electronic design with average complexities and size to around ten (10) seconds.

Another advantage of these techniques described herein is that these techniques do not require or need any binary decision diagrams, and that the memory footprint of sensitizing an electronic design may be reduced because no such BDDs need to be constructed. The elimination of a binary decision diagram reduces the total runtime of sensitization of an electronic design because no processing time is needed to construct and traverse a binary decision diagram.

Another advantage of these techniques is that these techniques may directly determine the switch vectors that determine whether the switching behaviors of the electronic design are as intended or designed by solving the CNF-based satisfiability at a satisfiability solver. As a result, those less accurate DC vectors in conventional approaches are no longer needed to determine the switch vectors. Eliminating the need for DC vectors further reduces both the runtime and memory footprint when compared to conventional approaches.

It shall be noted that with the transistor level SAT models representing an electronic design, DC vectors may be easily computed if these DC vectors become desired or required for sensitization of certain particular circuit components in the electronic design. In some embodiments where an electronic design of interest includes such particular circuit components, DC vectors may be desired for sensitizing only those paths including such circuit components that may exhibit some internal states (e.g., tri-state devices, latches, etc.), while the remainder of the electronic design is nevertheless implemented with transistor level SAT models and solved at an SAT solver module. In these embodiments, the techniques described herein may determine only the reduced set of DC vectors for the affected portion of the electronic design, instead of a full set of DC vectors for the entire electronic design, and perform a limited scope simulation with the reduced set of DC vectors to sensitize these paths in order to determine the corresponding switch vectors, without performing simulations on the entire electronic design with the full set of DC vectors.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1A illustrates a high level block diagram for a method or system for implementing an electronic design with transistor-level satisfiability models in some embodiments. In these embodiments, A plurality of channel connected components of an electronic design of interest may be identified at 102 for sensitization. The electronic design may include a transistor network that may be further partitioned into the plurality of channel connected components. A channel connected component may include at least one transistor path from a voltage source (e.g., Vdd) through one or more intermediate nodes to an output node. As described above, a channel connected component (CCC) may be a component having a set of transistors connected by their drain and/or source terminals. Any partitioning algorithms or mechanisms may be used to partition an electronic design into channel connected components.

For a channel connected model in the identified plurality of channel connected components, a set of transistor level satisfiability (SAT) models may be identified at 104 from existing transistor level satisfiability models or may be determined anew for the channel connected component. A transistor level satisfiability model may include at least one of two models—an SAT logic model and an SAT state model. Each circuit component (e.g., a wire, a MOS device, etc.) may be represented with one or more transistor level SAT models that may be derived from the design specification, circuit theories, and/or the fundamental characteristics of the circuit component. For example, a wire may be represented as a logic model indicating the logic value of the wire and a wire state model indicating whether the wire is driven or floating. As another example, a MOS device in a channel connected component may also be represented with one or more logic models constraining the operation of the MOS device and one or more state models capturing the constraints the directionality and states of the MOS device during operation. In addition to transistor level SAT models for individual circuit components, additional transistor level SAT models may also be identified from an existing repository of transistor level SAT models or may be determined anew for a group of circuit components based on the topology, design specification, and/or characteristics of the group of circuit components. For example, these additional transistor level SAT models may include loop detection or prevention SAT state models, wire state resolution SAT models, switch models, etc. More details about the logic models and state models for individual circuit components (e.g., wires, MOS devices, etc.) and for groups of circuit components will be described below with reference to FIGS. 3A-G. With these transistor level SAT models for individual circuit components and groups of circuit components, each of the channel connected components identified at 102 may be transformed into and hence represented by these transistor level SAT models determined at 104.

Each transistor level SAT model and hence the plurality of channel connected components may be transformed at 106 into a set of one or more conjunctive normal form (CNF) clauses or formulae by using, for example, the Tseitin transformation or other similar transformations. Each CNF clause or formula includes one or more variables (e.g., wires, states of circuit components, etc.) representing one or more characteristics of a portion of the electronic design and represents one or more constraints that are to be satisfied by a corresponding portion of the electronic design. This set of CNF clauses or formulae may be conjoined to represent the satisfiability problem or the circuit satisfiability (Circuit-SAT) problem of the electronic design.

Once the plurality of channel connected components are similarly transformed into conjunctive normal forms, the electronic design may be sensitized at 108 at least by determining one or more satisfying assignments for the set of CNF formulae at one or more SAT solvers. That is, the satisfiability problem or the circuit satisfiability problem obtained by transforming transistor level SAT models into the set of CNF formulae may be solved at 108 by one or more SAT solver modules to identify satisfying assignments that render the set of CNF formulae true. In some embodiments, the set of CNF formulae may also be used to directly compute switch vectors, which are a form of assignments that cause valid switching behaviors, without performing any simulations. In this manner, the plurality of channel connected components may be more efficiently sensitized at least by determining one or more satisfying assignments, each having a plurality of values corresponding to a plurality of variables, for the set of CNF clauses or formulae.

As a practical example without referencing any real circuit components, SAT solver modules usually accept inputs in conjunctive normal forms. A conjunctive normal form includes a logic AND of logic ORs of literals. In the CNF regime, an atom denotes a propositional variable (e.g., the variable L(wire) indicating the logic value of the wire, the variable D(wire) indicating whether the wire is driven or floating, etc.), and a literal denotes an atom or its negation (e.g., D(wire) indicating the wire is driven, D(wire)' indicating the wire is floating, etc.)

A clause denotes a disjunction of a plurality of literals. An example of a clause may be D(wire1) v D(wire2)' v D(wire3), where the symbol "v" denotes the logical disjunction, and the symbol "'" denotes the inverse. A CNF formula may include a conjunction of a plurality of clauses. An example of a CNF formula may be (D(wire1) v D(wire2)' v D(wire3)) ^(L(wire)' v L(wire2) v L(wire3)'), where the symbol "^" denotes logical conjunction. A CNF formula is satisfied (or satisfiable) by a variable assignment if every clause in the formula has at least one literal that is true under that assignment. On the other hand, a formula is unsatisfied (or unsatisfiable) by a variable assignment if at least one clause's literals are all false under that variable assignment.

Once the transistor level SAT models are transformed into corresponding CNFs, these CNFs may be provided to an SAT solver module to solve the satisfiability problem by finding satisfying assignments. For example, an SAT solver module may check to determine if a given CNF formula $F(x1, x2, \ldots, xn)$ can ever be evaluated true (or satisfiable) and return the values of the variables (xi's) that cause the given CNF formula to be evaluated true as a satisfying assignment or vector. That is, the given CNF represents a set of constraints in linear space and time; and an SAT solver module exploits and determines whether the CNF formula is satisfiable by determining whether an assignment of the variables (xi's) satisfying all the constraints exist. It is known that a satisfying assignment exists for a satisfiability problem if and only the underlying electronic design is satisfiable, and that a solution to the satisfiability problem is a solution to the underlying circuit.

Figure 1B:
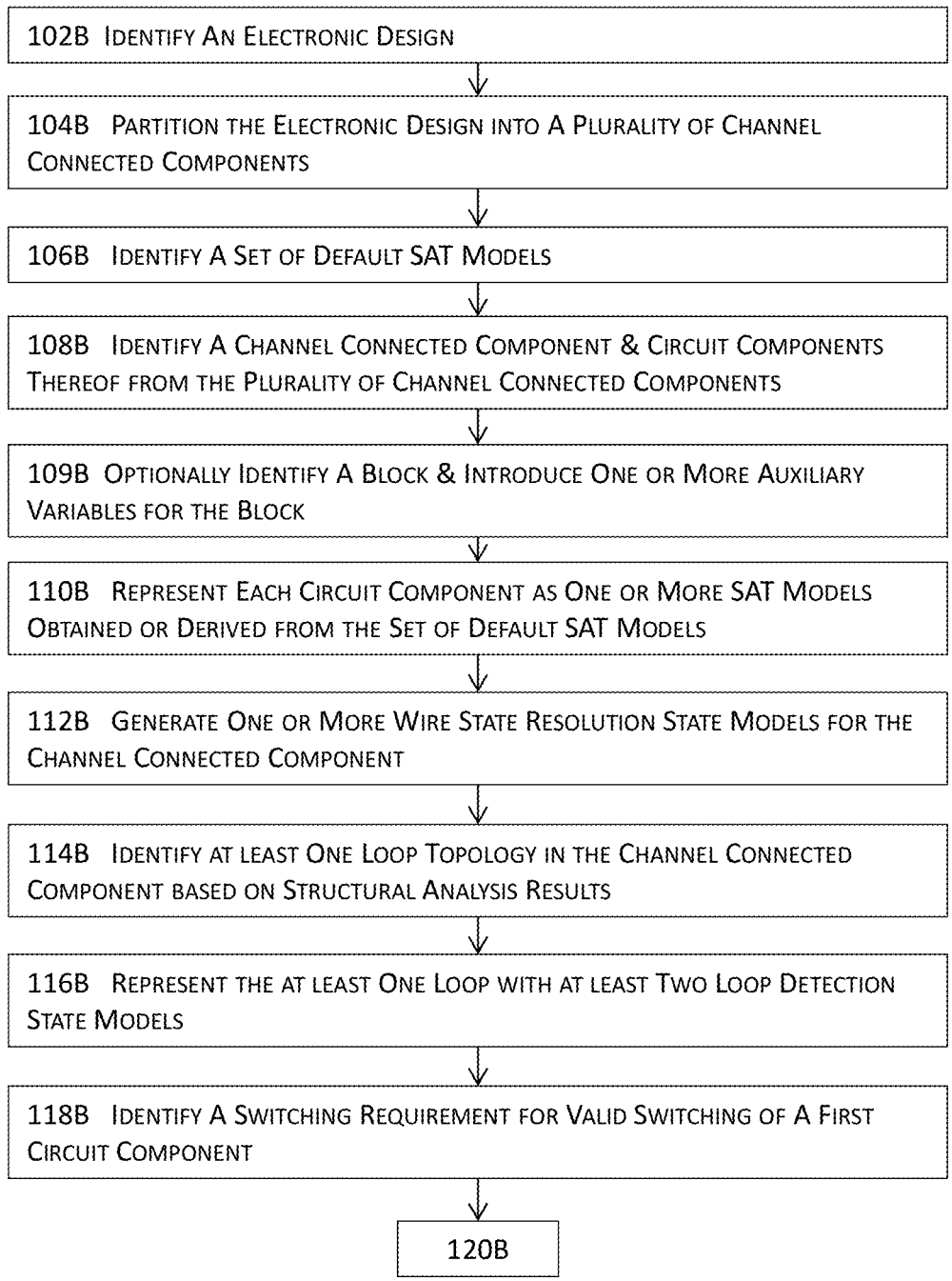
FIGS. 1B-1C jointly illustrate a more detailed flow diagram for implementing an electronic design with transistor-level satisfiability models in some embodiments.
Figure 1C:
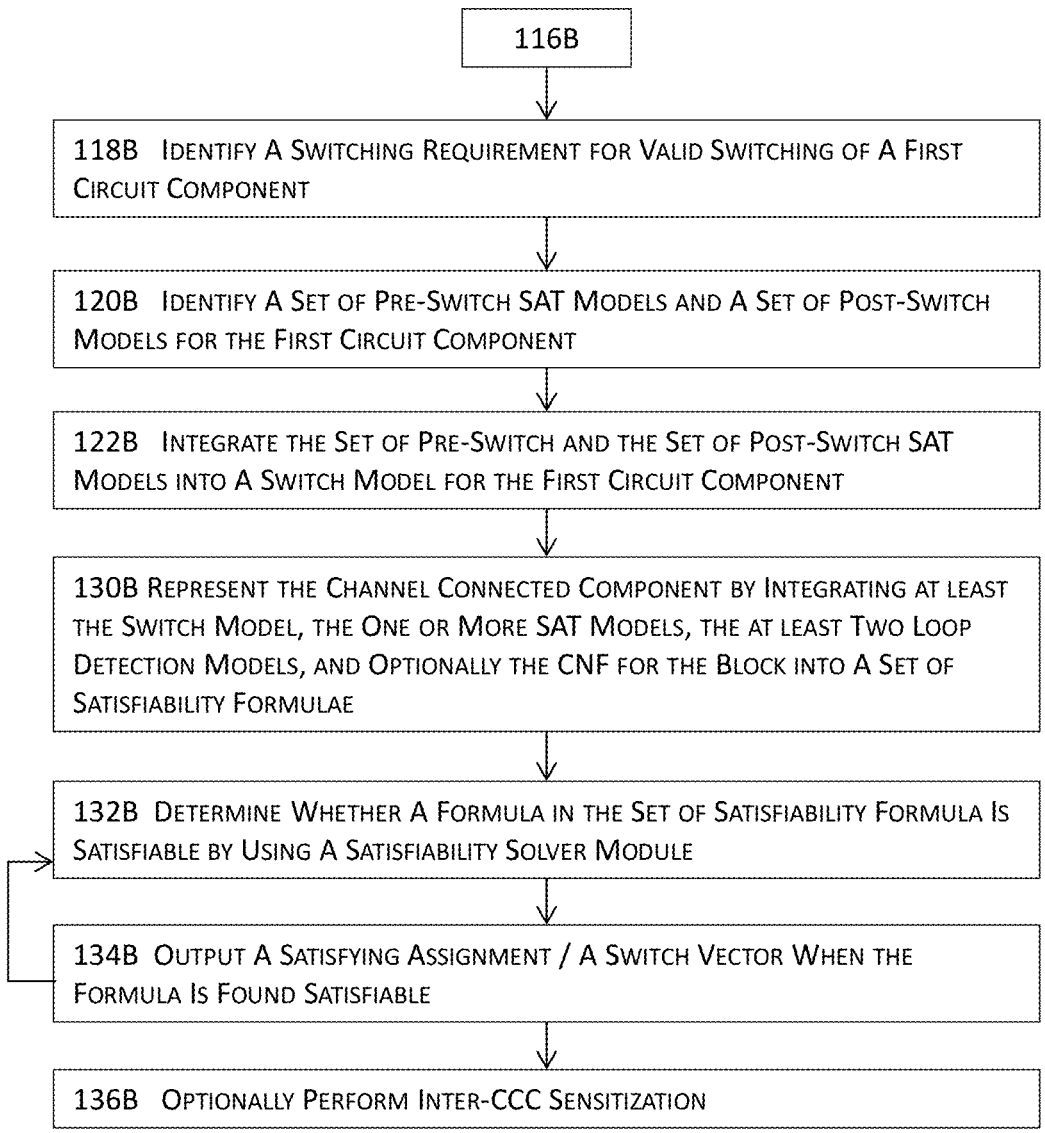

FIGS. 1B-1C jointly illustrate a more detailed flow diagram for implementing an electronic design with transistor-level satisfiability models in some embodiments. In these embodiments, an electronic design to be sensitized or verified may be identified at 102B, and the electronic design may be partitioned into a plurality of channel connected components at 104B with any partitioning algorithm or mechanism. A set of default transistor level SAT models may be identified at 106B. This set of default SAT models may serve as the basis to represent a channel connected component with transistor level SAT models that may be further transformed into conjunctive normal forms for SAT solver modules.

A channel connected component including a plurality of circuit components may be identified at 108B from the plurality of channel connected components. The plurality of circuit components in the identified channel connected component may include, for example, wires, transistors, etc. In some embodiments where the complexity of a block is relatively high, representing each circuit component in the block with its corresponding transistor level SAT models and subsequently transforming these corresponding transistor level SAT models into conjunctive normal forms may result in conjoining a large number of CNFs.

In these embodiments, a block with relatively high complexity may be identified, and one or more auxiliary variables may be optionally introduced at 109B during the determination of a SAT model for the block. For example, auxiliary variables such as Dsrc(mos) and Ddrn(mos) respectively representing whether the source and drain are driven or floating may be optionally introduced to model a relatively complex block. A local transformation may also be optionally performed to transform the logic of the block into a CNF formula at 109B. For example, these techniques may assign the output of a gate and perform a local transformation to convert the logic of the gate into corresponding conjunctive normal forms that are conjoined together to avoid having a large number of CNF clauses for the block as modeling each circuit component with corresponding CNF clauses will produce.

Each of the plurality of circuit components may be represented at 110B with one or more transistor level SAT models. These one or more transistor level SAT models may be obtained directly from the set of default transistor level SAT models in some embodiments. In some other embodiments, at least one of the one or more transistor level SAT models may be derived anew or from some of the set of default transistor level SAT models based in part or in whole upon one or more criteria including, for example, the design specification, intended functions of the circuit components, the context that a particular circuit component may be situated, fundamental circuit theories, and/or the fundamental characteristics of the particular circuit component. More details about the construction and generation of transistor level SAT models will be described below with reference to FIGS. 3A-G.

A wire may be usually represented with a logic variable (e.g., L(wire)) indicative of the logic value of the wire. A wire may also be represented with a state variable (e.g., D(wire)) indicative of the state of the wire (e.g., D(wire)=1 or simply D(wire) indicating the wire is driven or D(wire)=0 or simply D(wire)' indicating the wire is floating). As described above, a channel connected component includes a plurality of transistors connected at their source and/or drain channels via one or more wires. To model and represent a channel connected component, a wire state resolution state model for each wire may also be included as a part of the transistor level SAT model in some embodiments. This wire state resolution state model represents the state (e.g., driven or floating) of the wire based on the state of the plurality of transistors connected via the wire. More details about an example of such wire state resolution state models are described below with reference to FIG. 3C.

At least one loop topology in the identified channel connected component may be identified at 114B based in part or in whole upon, for example, the results of one or more structural analyses or connectivity information. As described above, the presence of a loop topology, if not controlled, may result in incorrect yet valid determination of assignments of the states of the transistors in the loop topology. To prevent or avoid such a loop topology from producing incorrect assignments, the at least one loop topology may be represented at 316B with at least two loop detection state models where one of the at least two loop detection state models. One of the at least two loop detection states models is to prevent or avoid clockwise loop topology from occurring, and the other is to prevent or avoid counter-clockwise loop topology from occurring. More details about the generation of loop detection state models will be described in greater details with reference to FIG. 3D below.

Various techniques described herein may also be used to determine switch models that may be further used to determine valid switching behavior or to determine whether switching of one device as a result of the switching of another device is valid. In some embodiments, a switching requirement or constraint for valid switching of a first circuit component may be identified at 118B. The switching requirement or constraint may be used to determine, for example, whether the first circuit component switches as designed or intended. A set of transistor level pre-switch SAT models and a set of transitory level post-switch SAT models may be identified at 120B for the first circuit component. In some embodiments, the set of transistor level pre-switch SAT models may include the pre-switch SAT logic models of the first circuit component, and the set of the transistor level post-switch SAT models may include the post-switch SAT logic models and the post-switch SAT state models of the first circuit component.

These two sets of transistor level SAT models may be integrated at 122B into a switch model for the first circuit component. The set of transistor level pre-switch SAT models may also optionally include the pre-switch SAT state models of the first circuit component to further constrain the first circuit component, but the inclusion of pre-switch SAT state models in the set of transistor level pre-switch SAT models is entirely optional. By integrating the pre-switch and post-switch logic models and at least the post-switch state models into the switch model for the first circuit component, an SAT solver module may directly determine the switch vectors, without pre-computing the DC vectors and without performing simulations with the pre-computed DC vectors to determine the switch vectors. More details about the generation of a switch model are described below with reference to FIGS. 2B and 3E.

With these various transistor level SAT models determined, the channel connected component identified at 108B may be represented by integrating at least the switch model determined at 122B, the one or more transistor SAT models determined at 110B, the one or more wire state resolution state models determined at 112B, and the at least two loop detection state models determined at 116B into a set of satisfiability CNF formulae at 130B. A CNF formula may be provided to a satisfiability solver module that determines whether the CNF formula is satisfiable at 132B. If the satisfiability solver module identifies an assignment of a plurality of variables in the CNF formula that causes the CNF formula to be true, the satisfiability solver module outputs the assignment as a satisfying assignment or a switch vector at 134B, depending upon the CNF formula. The process may return to 132B to determine whether another satisfying assignment may be found until satisfying assignments are identified and output. In some embodiments, inter-CCC sensitization may be optionally performed at 136B. In some of these embodiments, a timing arc may be identified; and one or more transistor level satisfiability models may be identified for the timing arc. The timing arc may be sensitized by propagating one or more constants or values for one or more variables in the one or more transistor level satisfiability models to determining whether the satisfiability problem corresponding to the one or more transistor level satisfiability models may be satisfied. More details about such inter-CCC sensitization are described below with reference to FIG. 3G.

Figure 2A:
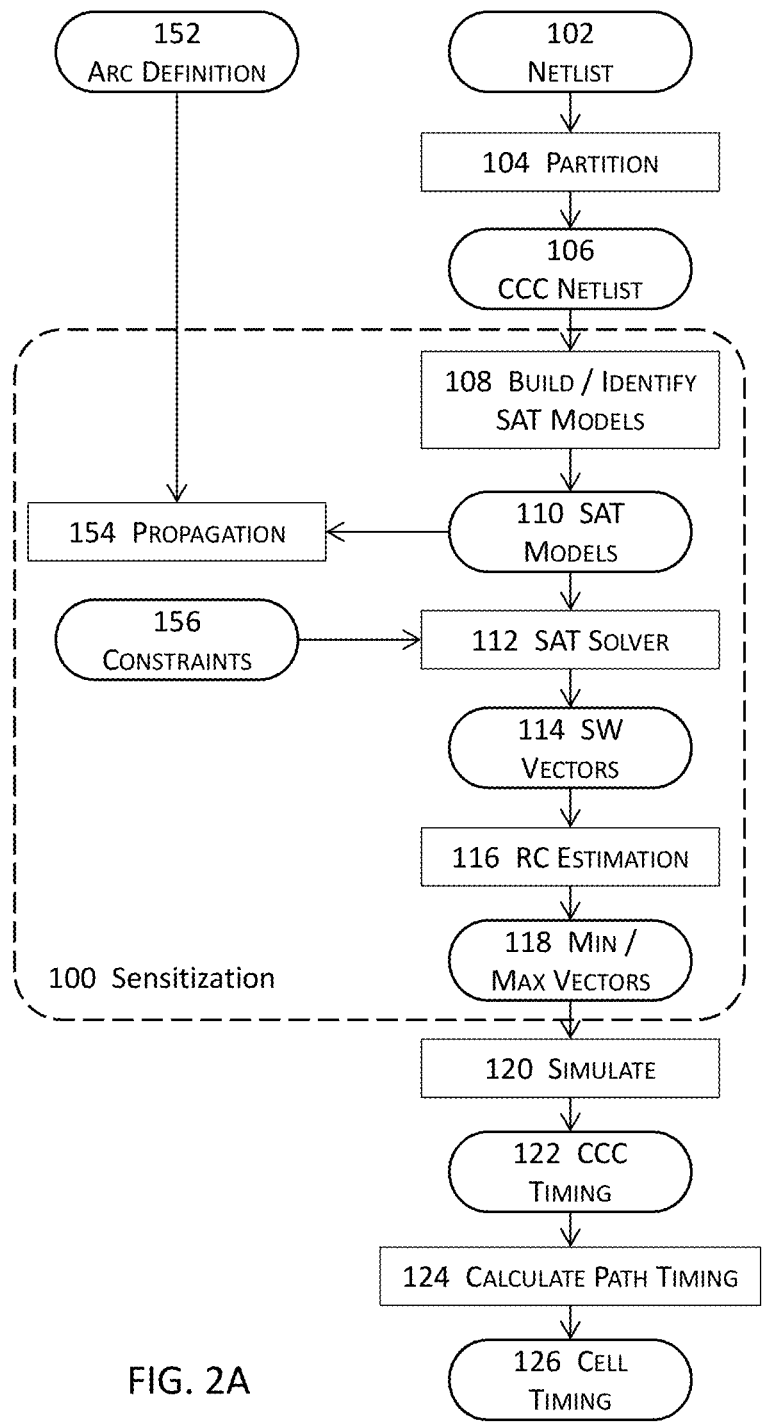
FIG. 2A illustrates a block diagram for implementing an electronic design with transistor-level satisfiability models in some embodiments.

FIG. 2A illustrates a block diagram for implementing an electronic design with transistor-level satisfiability models in some embodiments. In these embodiments, a netlist (e.g., a cell netlist) 102 may be identified at a partitioning mechanism 104 that partitions the netlist into a channel connected component netlist 106. The sensitization process includes the process steps from identifying or building a plurality of SAT models at 108 through the determination of the minimum and/or maximum vectors 118. More specifically, a plurality of transistor level SAT models 110 may be identified from an existing repository of transistor level SAT models or built anew at 108. As described in greater details with reference to FIG. 3G, the plurality of transistor level SAT models may be used in an inter-CCC manner to propagate values or constants at 154 for sensitizing one or more timing arcs 152.

These transistor level SAT models 110 may be provided to a satisfiability solver module 112 to directly compute the switch vectors 114, without pre-computing DC vectors or performing simulations with the pre-computed DC vectors. The satisfiability solver module 110 may also solve the satisfiability problem for the netlist identified at 102 with the provided constraints 156 to identify one or more satisfying assignments. The switch vectors or satisfying assignments may be further provided to an RC estimation module 116 to determine minimum and/or maximum vectors 118. These minimum and/or maximum vectors may be provided to a simulation module 120 to determine the timing information or data 122 which may be further provided to a timing analysis module 124 to calculate timing data of various paths in the netlist identified as well as timing data 126 for various cells at 102.

Figure 2B:
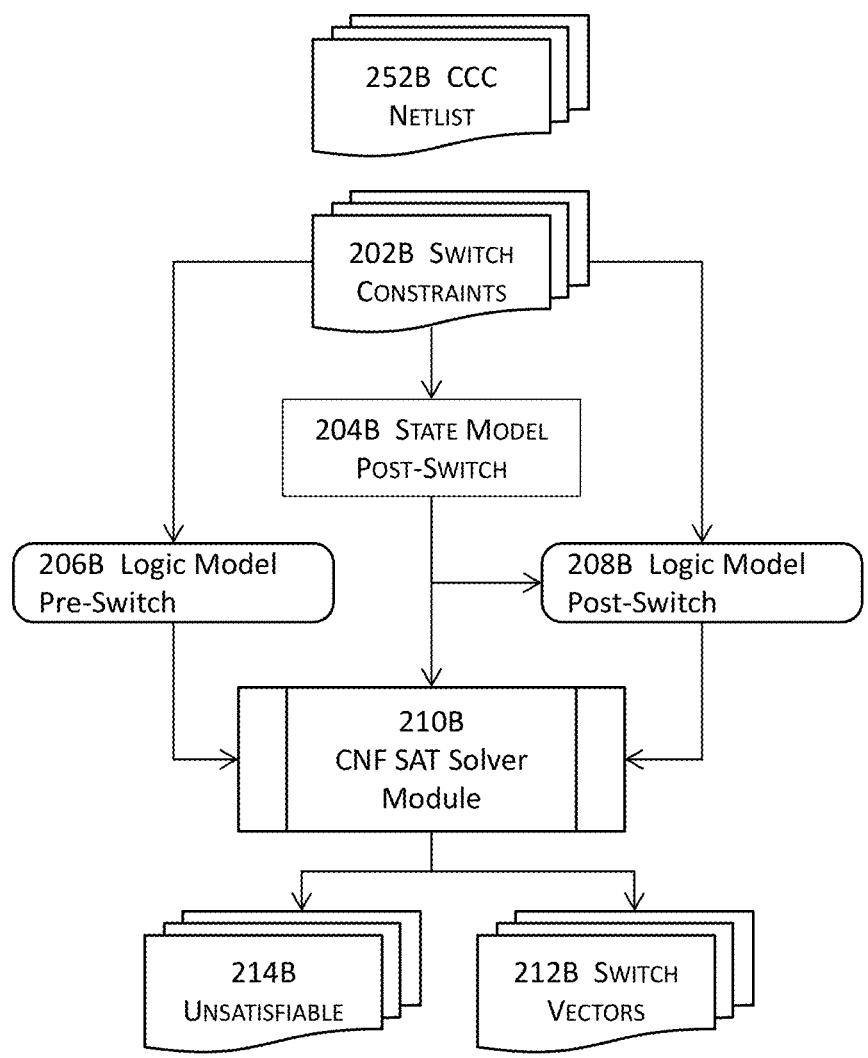
FIG. 2B illustrates another block diagram for implementing an electronic design with transistor-level satisfiability models in some embodiments.

FIG. 2B illustrates another block diagram for implementing an electronic design with transistor-level satisfiability models in some embodiments. More specifically, FIG. 2B illustrates the determination of a switch model by integrating the pre-switch logic model, the post-switch logic model, and the post-switch state model of a circuit component into a switch model. In these embodiments, one or more switch requirements or constraints 202B may be identified and provided to pre-switch logic model 206B, the post-switch logic model 208B, and the post-switch state model of a circuit component. These one or more switch requirements or constraints may impose the requirement that, for example, for each wire "wire", if Driven_post(wire)=0 (e.g., the wire is not driven or is floating) then logic_pre(wire)=logic_post (wire). This switch constraint indicates that if a wire is not driven in the post-switch mode, then the logic value of the wire should remain unchanged (e.g., the pre-switch logic value of the wire and the post-switch logic value of the wire should remain identical).

A post-switch state model may include the state variable Driven(wire) for each wire to indicate whether the wire is driven or is floating, where Driven(wire)=1 indicates the wire is driven, and Driven(wire)=0 indicates the wire is floating. The post-switch state model may further include the directionality variable Dir(mos) for each MOS transistor that is on, where Dir(mos)=1 indicates that the state is transferred from the source to the drain, and Dir(mos)=0 indicates that the state is transferred from the drain to the source. This directionality variable for a MOS transistor may be ignored when the MOS transistor is off.

In addition, the post-switch state model may include the state variables Driven_src(mos) and Driven_drn(mos) that respectively represent whether the source and drain of a MOS transistor are driven through the MOS transistor. To capture the bi-directionality of a MOS transistor, Driven_src (mos) and Driven_drn(mos) cannot be both "1" at the same time because a MOS transistor can only transfer a state through one direction at a given instant of time.

One or more additional constraints may be imposed on the post-switch state model of a circuit component. These one or more additional constraints may include a wire constraint Driven(wire)=1 if and only if the source (or drain) terminal of a MOS transistor connects to the wire, and Driven_src (wire)=1 (or Driven_drn(wire)=1). These one or more additional constraints may further include a first MOS constraint that requires Driven_src(mos)=0 and Driven_drn(mos)=0 if the MOS transistor is off. These one or more additional constraints may further include a second MOS constraint that requires Driven_drn(mos)=0 and Driven_src(m) =Driven(drain wire of MOS) if the MOS transistor is on and Dir(mos)=0.

These one or more additional constraints may further include a third MOS constraint that requires Driven_src (mos)=0 and Driven_drn(mos)=Driven(source wire of MOS) if the MOS transistor is on and Dir(mos)=1 (e.g., state transferred from source to drain). These one or more additional constraints may further include a fourth MOS constraint that requires Driven(source wire of MOS)=Driven (drain wire of MOS) if the MOS transistor is on. For a channel connected cycle of MOS'es (m1, m2, . . . ), these one or more additional constraints may further include a fifth MOS constraint that requires Dir(mi) such that at least one pair of MOS'es in the cycle has an opposite direction.

As in most wires, each of the pre-switch logic model 206B and the post-switch logic model 208B includes a wire variable (e.g., Logic(wire)) that indicates the logic value of the wire. When a MOS transistor is on, the wire connected to its source terminal and the wire connected to its drain terminal should have the same logic value, and this characteristic may be represented as the logic model: Logic(source wire of MOS)=Logic(drain wire of MOS).

These pre-switch logic model 206B, the post-switch logic model 208B, and post-switch state model 204B may be provided to one or more SAT solver modules 210B to compute switch vectors 212B or to determine that no valid switch vectors may be found, and that the switch model is thus unsatisfiable (214B).

Figure 3A:
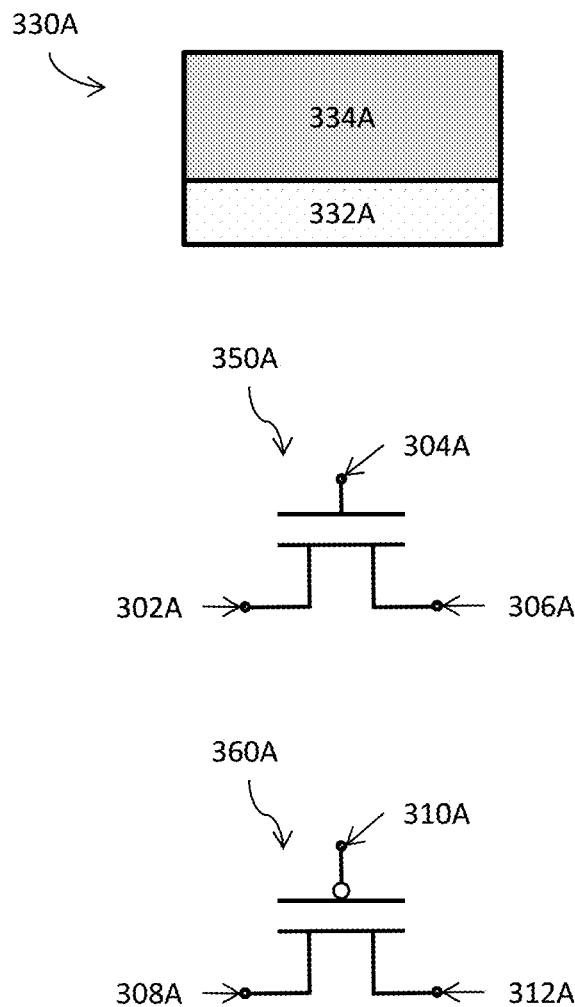
FIG. 3A illustrates an example of a transistor level satisfiability model for a MOS device in some embodiments.

FIG. 3A illustrates an example of a transistor level satisfiability model for a MOS device in some embodiments. More specifically, FIG. 3A illustrates an example of modeling a MOS device with transistor-level SAT models in some embodiments. In these embodiments, a transistor-level SAT model 330A may include a logic model and a state model 334A. A logic model includes a light-weight model for a logic value of a circuit component (e.g., a wire, etc.) in an electronic design. A state model, on the other hand, includes a model that includes one or more relations between one or more state variables of a circuit component (e.g., a wire, a MOS device, etc.) In the example illustrated in FIG. 3A, an n-channel MOS (NMOS) 350A includes the source terminal "s" 302A, the gate terminal "g" 304A, and the drain "d" terminal 306A and may be modeled with a logic variable L(wire). More specifically, when the NMOS 350A is on and off, L(g) may assume the value of "1" (one) and "0" (zero), respectively. When the gate 304A is on, the source terminal 302A and the drain terminal 306A have the same value. Therefore, the transistor level SAT model for NMOS 350A may be represented as:

$$L(g) \rightarrow L(s) = L(d) \quad (1)$$

This model may be transformed into the following conjunctive normal form:

$$(L(g')+L(s')+L(d))(L(g')+L(s)+L(d')) \quad (2)$$

In this NMOS example, there is no constraint on the NMOS 350A when the NMOS 350A is off.

In the example illustrated in FIG. 3A, a p-channel MOS (PMOS) 360A includes the source terminal "s" 308A, the gate terminal "g" 310A, and the drain "d" terminal 312A and may also be modeled with the logic variable L(wire). More specifically, when the PMOS 360A is off and on, L(g) may assume the value of "1" (one) and "0" (zero), respectively. When the PMOS 360A is on (L(g)=0), the source terminal 308A and the drain terminal 312A have the same value.

Therefore, the transistor level SAT logic model (e.g., 332A) for PMOS 360A may be represented as:

$$L(g')\rightarrow L(s)=L(d) \quad (3)$$

$$(L(g)+L(s')+L(d))(L(g)+L(s)+L(d')) \quad (4)$$

In this PMOS example, there is also no constraint on the PMOS 360A when the PMOS 360A is off. With these CNF logic models expressed in (1)-(4), every MOS device in an electronic design may be represented in conjunctive normal forms that may be further provided to an SAT solver module to determine satisfying assignments that satisfy these CNF formulae and thus solve the satisfiability problem for the underlying electronic design. For the electronic design or a portion thereof comprising multiple MOS devices, the respective transistor level satisfiability models (e.g., the logic models represented in formulae (1)-(4)) may be distinguished from each other by referencing, for example, the unique identifier of each MOS device or one or more other unique identifiers (e.g., a net identifier, a cell identifier, etc.), while the corresponding gate, source, and drain terminals may also refer to or be combined with these one or more unique identifiers to distinguish two gate terminals of two MOS devices from each other in the satisfiability solver module.

Figure 3B:
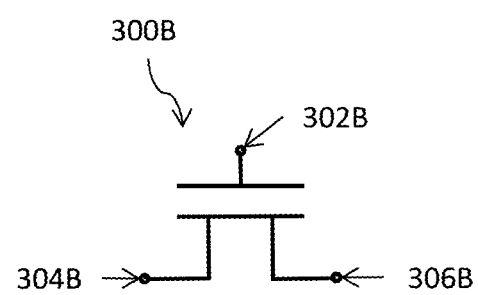
FIG. 3B illustrates an example of a state model in a transistor level satisfiability model for a MOS device in some embodiments.

FIG. 3B illustrates an example of a state model in a transistor level satisfiability model for a MOS device in some embodiments. More specifically, FIG. 3B illustrates an example of an SAT state model for modeling the NMOS 300B having the gate terminal 302B, the source terminal 304B, and the drain terminal 306B. The state model in this example may be used to constrain the state on a wire to indicate whether the wire is either driven (e.g., by a driver signal) or floating. As a result, a variable, D(wire), may be introduced for this state model (e.g., 334B in FIG. 3A) to represent a wire being driven (D(wire)=1) or floating (D(wire)=0).

To capture the bi-directional pass characteristic of an MOS transistor, the state model of this NMOS 300B may further include a directionality variable, Dir(mos), where Dir(mos)=1 represents that the NMOS passes from source to drain, and Dir(mos)=0 represents that the NMOS passes from drain to source. The directionality variable Dir(mos) is introduced to indicate that both the source and drain are driving is disallowed for NMOS 300B. In addition, two more state variables may be added to the state model to represent the driven or not drive state of the drain and source terminals. For example, the drain terminal variable Ddrn(mos) may be introduced to represent that the drain terminal is driven (Ddrn(mos)=1); and the source terminal variable Dsrc(mos) may be similarly introduced to represent that the source terminal is driven (Dsrc(mos)=1).

If the direction of the NMOS 300B is zero (Dir(mos)=0 or Dir(mos)') when the wire is driven or not floating (hence L(g)=1 or simply L(g)), this indicates that the NMOS 300B is on and passes from drain to source. That is, the source terminal is driven and hence Dsrc(mos)=D(d). This scenario also indicates that the drain terminal is not driven and hence Ddrn(mos)=0 or simply Ddrn(mos)' where the symbol "'" indicates the inverse of the Boolean expression Ddrn(mos). In addition, the fact that the NMOS 300B is on in this scenario may be represented by L(g)→D(d)=D(s). With these four variables (Dir(mos), D(wire), Ddrn(mos), and Dsrc(mos)), the NMOS may be represented as the following:

$$Dir(mos)'L(g)\rightarrow Ddrn(mos)'(Dsrc(mos)=D(d)) \quad (5)$$

$$L(g)\rightarrow D(d)=D(s) \quad (6)$$

In the inverse scenario where the direction of the NMOS 300B is one (Dir(mos)=1 or Dir(mos)) indicating the wire is floating and not driven (hence L(g)=0 or simply L(g)'), this indicates that the NMOS 300B is off and passes from the source to the drain. That is, the drain terminal is driven and hence Ddrn(mos)=D(s). This scenario also indicates that the source terminal is not driven and hence Dsrc(mos)=0 or simply Dsrc(mos)' where the symbol "'" similarly indicates the inverse of the Boolean expression Dsrc(mos). In addition, the fact that the NMOS 300B is off in this scenario may be represented by L(g)' →Dsrc(mos)' Ddrn(mos)'. With these four variables (Dir(mos), D(wire), Ddrn(mos), and Dsrc(mos)), the NMOS may be represented as the following:

$$Dir(mos)L(g)\rightarrow Dsrc(mos)'(Ddrn(mos)=D(s)) \quad (7)$$

$$L(g)'\rightarrow Dsrc(mos)'Ddrn(mos)' \quad (8)$$

These four state models or constraints on the states of the NMOS 300B may be transformed into the following CNF clauses by using, for example, a transformation based on logical equivalence rules:

$$(Dir(mos)+L(g)'+Ddrn(mos)') \quad (9)$$

$$(Dir(mos)+L(g)'+Dsrc(mos)'+D(d)) \quad (10)$$

$$(Dir(mos)+L(g)'+Dsrc(mos)+D(d)') \quad (11)$$

$$(Dir(mos)'+L(g)'+Dsrc(mos)') \quad (12)$$

$$(Dir(mos)'+L(g)'+Ddrn(mos)'+D(s)) \quad (13)$$

$$(Dir(mos)'+L(g)'+Ddrn(mos)+D(s)') \quad (14)$$

$$(L(g)'+D(d)'+D(s)) \quad (15)$$

$$(L(g)'+D(d)+D(s)') \quad (16)$$

$$(L(g)+Dsrc(mos)') \quad (17)$$

$$(L(g)+Ddrn(mos)') \quad (18)$$

Formulae (9)-(18) in CNF forms may thus be provided to a SAT solver module to represent the state models of the NMOS 300B. It shall be noted that the bi-directionality of the NMOS 300B is captured in the aforementioned CNF state models while both the source and the drain are driving is disallowed as described above. In this example illustrated in FIG. 3B, the CNF formulae for the state models and hence the size of the SAT model representation is still linear, rather than exponential as in conventional approaches with BDDs or ROBDDs, to the size of the underlying electronic design.

For a PMOS, a substantially similar set of formulae may be derived by respectively replacing the variable L(g) (the logic value of the gate terminal) and L(g)' with L(g)' and L(g) in formulae (9)-(18) listed above. For example, a substantially similar of formulae for a PMOS may be expressed as follows:

$$(Dir(mos)+L(g)+Ddrn(mos)') \quad (9')$$

$$(Dir(mos)+L(g)+Dsrc(mos)'+D(d)) \quad (10')$$

$$(Dir(mos)+L(g)+Dsrc(mos)+D(d)') \quad (11')$$

$$(Dir(mos)'+L(g)+Dsrc(mos)') \quad (12')$$

$$(Dir(mos)'+L(g)+Ddrn(mos)'+D(s)) \quad (13')$$

$$(Dir(mos)'+L(g)+Ddrn(mos)+D(s)') \quad (14')$$

$$(L(g)+D(d)'+D(s)) \quad (15')$$

$$(L(g)+D(d)+D(s)') \quad (16')$$

$$(L(g)'+Dsrc(mos)') \quad (17')$$

$$(L(g)'+Ddrn(mos)') \quad (18')$$

Figure 3C:
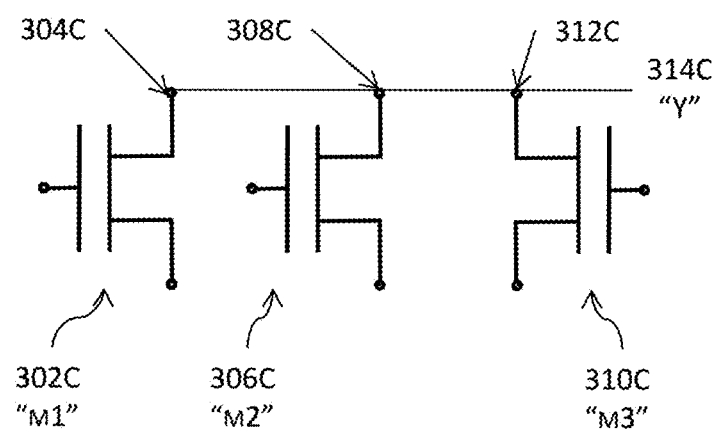
FIG. 3C illustrates an example of a state model in a transistor level satisfiability model for an example of a channel connected component in some embodiments.

FIG. 3C illustrates an example of a state model in a transistor level satisfiability model for an example of a channel connected component in some embodiments. More specifically, FIG. 3C illustrates an example of resolving the states of a wire with transistor level satisfiability state models. In this example, NMOS "m1" 302C, "m2" 306C, and "m3" 310C are connected at their drain terminals (304C for 302C, 308C for 306C, and 312C for 310C) to a wire "Y" 312C. The actual wire state may be resolved as the logical OR (disjunction OR) of the connected terminals. Therefore, the state of the wire "Y" 314C is the logical OR of all the states of the connected drain terminals, and the state model may thus be represented as:

$$D(y)=Ddrn(m1)+Ddrn(m2)+Dsrc(m3) \quad (19)$$

This state model (19) may be transformed into CNF clauses as follows:

$$(D(y)'+Ddrn(m1)+Ddrn(m2)+Dsrc(m3)) \quad (20)$$

$$(D(y)+Ddrn(m1)') \quad (21)$$

$$(D(y)+Ddrn(m2)') \quad (22)$$

$$(D(y)+Dsrc(m3)') \quad (23)$$

As it can be seen from the example illustrated in FIG. 3C, the CNF formulae for the wire state resolution and hence the size of the SAT model representation is still linear to the size of the underlying electronic design. This is contrary to and advantageous over conventional approaches using binary decision diagrams or reduced order binary decision diagrams where the size of the decision diagram may be exponential with respect to the size of the underlying electronic design.

Figure 3D:
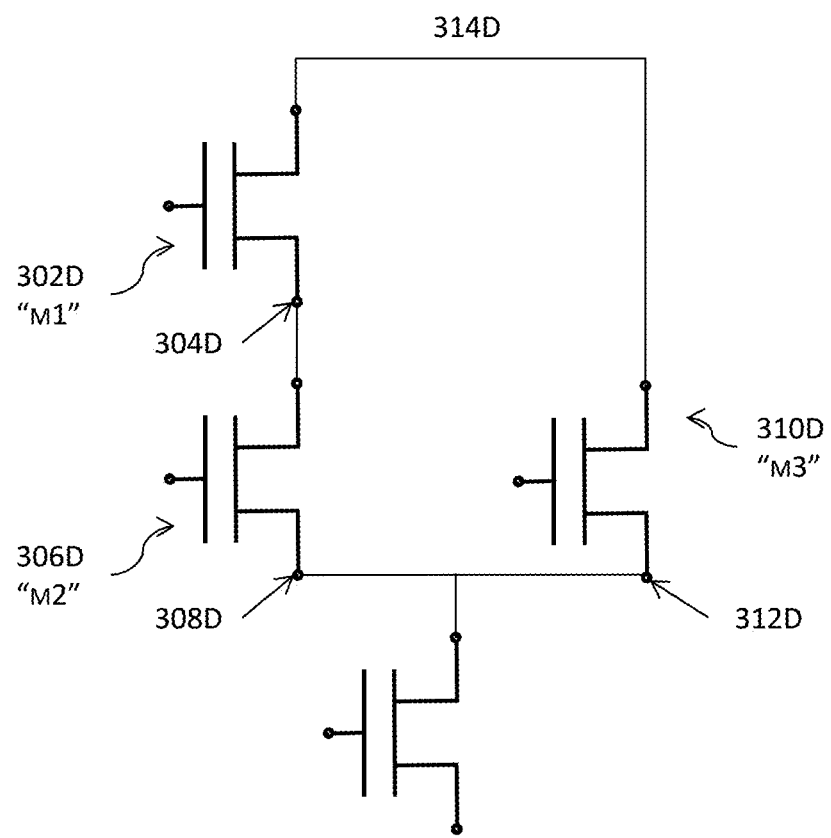
FIG. 3D illustrates an example of a state model in a transistor level satisfiability model for loop detection in some embodiments.

FIG. 3D illustrates an example of a state model in a transistor level satisfiability model for loop detection in some embodiments. More specifically, FIG. 3D illustrates the application of implementing an electronic design with transistor level satisfiability models to an example of a simplified portion of an electronic design for loop detection. In this example, the drain terminal 304D of MOS 302D ("m1") is connected to the source terminal of MOS 306D ("m2"). The drain terminals 308D of MOS 306D ("m2") is connected to the drain terminal 312D of MOS 310D ("m3"). The source terminals of MOS 302D ("m1") and MOS 310D ("m3") are connected together but are not connected to a voltage source (e.g., Vdd or virtual Vdd or GND).

With the presence of the loop topology including the three MOS devices 302D, 306D, and 310D, conventional approaches involving SAT solvers may potentially create a loop of constraints where, for example, both "m1" 302D and "m2" 306D are driven upward, and "m3" 310D is driven downward. These conventional approaches may thus determine such a solution is valid although all three MOS devices may nevertheless be floating. The techniques described herein, on the other hand, may easily prevent such looping from occurring. For example, a structural analysis may identify a loop topology in an electronic design. These techniques may determine a first state equation to disallow a clockwise loop topology from occurring by using the directionality variable, Dir(mos), described above. More specifically, to disallow or avoid a clockwise loop topology ("m1" and "m2" being driven upward, and "m3" being driven downward), the following constraint may be introduced:

$$(Dir(m1)+Dir(m2)+Dir(m3)') \quad (24)$$

As described above, Dir(mos)=1 or simply Dir(mos) indicates the direction of the MOS device is from the source terminal to the drain terminal; and Dir(mos)=0 or simply Dir(mos)' indicates the direction of the MOS device is from the drain terminal to the source terminal.

Similarly, to disallow or avoid a counter-clockwise loop topology ("m1" and "m2" being driven downward, and "m3" being driven upward), the following constraint may be introduced:

$$(Dir(m1)'+Dir(m2)'+Dir(m3)) \quad (25)$$

With these two additional state models at the transistor level, both the clockwise loop topology and the counter-clockwise loop topology may be avoided because, for example, when "m1" 302D and "m2" 306D are driven upward from their respective drain to their respective source, Dir(m1)=0 and Dir(m2)=0. Nonetheless, the CNF formula (24) is true when Dir(m3)' is evaluated to "1"—when the direction of "m3" 312D is from its drain to its source. This avoids the clockwise loop topology from occurring in the example illustrated in FIG. 3D.

Figure 3E:
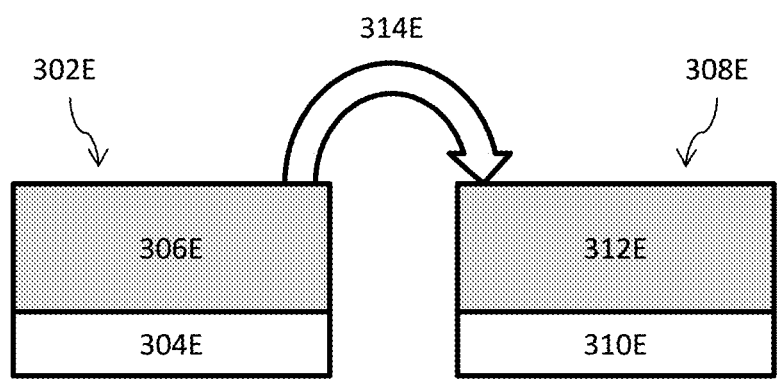
FIG. 3E illustrates an example of a switch model implemented with two transistor level satisfiability models in some embodiments.

FIG. 3E illustrates an example of a switch model implemented with two transistor level satisfiability models in some embodiments. In this example, the pre-switch SAT model 302E, which may include the pre-switch logic model 304E and optionally the pre-switch state model 306E, is combined with the post-switch SAT model 308E including the post-switch state model 312E and the post-switch logic model 31E. By combining the pre-switch model 302E with the post-switch model 308E of a circuit component as shown in FIG. 3E, the size of the model is still linear to the size of the underlying electronic design, and finding satisfying assignments for this combined model determines the switch vectors without pre-computing the DC vectors and without performing any simulations. A satisfying assignment indicates that the switching of the pre-switch model 302E causes, at 314E, the switching of the post-switch device 308E. In determining such an SAT switch model, the techniques described herein introduce three variables. The first variable, L_pre(wire), represents the logic value of a wire in the pre-switch logic model; the second variable, L_post (wire), represents the logic value of a wire in the post-switch logic model; and the third variable, Dpost(wire), represents the whether the wire is driven (Dpost(wire)=1 or simply Dpost(wire)) or floating (Dpost(wire)=0 or simply Dpost (wire)') after switching.

Moreover, it is known from basic circuit theory that when the post-switch state of a wire is floating, the logic value associated with the wire after switching should not change. This aspect may be modeled as the constraint D_post(wire) =0 or simply D_post(wire)' (e.g., the post-switch state of the wire is not driven). In addition, the pre-switch logic value and the post-switch logic value of this wire do not change and thus remain the same. This aspect may be modeled as L_pre(wire)=L_post(wire). Therefore, this switch model may be governed by the constraint as represented as the SAT model below:

$$D\_post(w)' \rightarrow L\_pre(w)=L\_post(w) \quad (26)$$

The aforementioned SAT state model (26) may further be transformed by using, for example, a transformation based on logical equivalence, into the following conjunctive normal forms:

$$(D\_post(w)+L\_pre(w)'+L\_post(w)) \quad (27)$$

$$(D\_post(w)+L\_pre(w)+L\_post(w)') \quad (28)$$

These two SAT models in the conjunctive normal forms may be provided to an SAT solver module to determine satisfying assignments that satisfy these CNF formulae and thus solve the satisfiability problem for the underlying electronic design. It shall be noted that the pre-switch driven or floating state model is not utilized in this example although pre-switch driven or floating state models may also be optionally used in determining the SAT state models for a switch model to impose further constraints on the underlying electronic design. The optional use of pre-switch driven or state models may reflect the further reduction in the size of the satisfiability problem and hence further reduction in the memory footprint and runtime in sensitizing an electronic design.

Figure 3F:
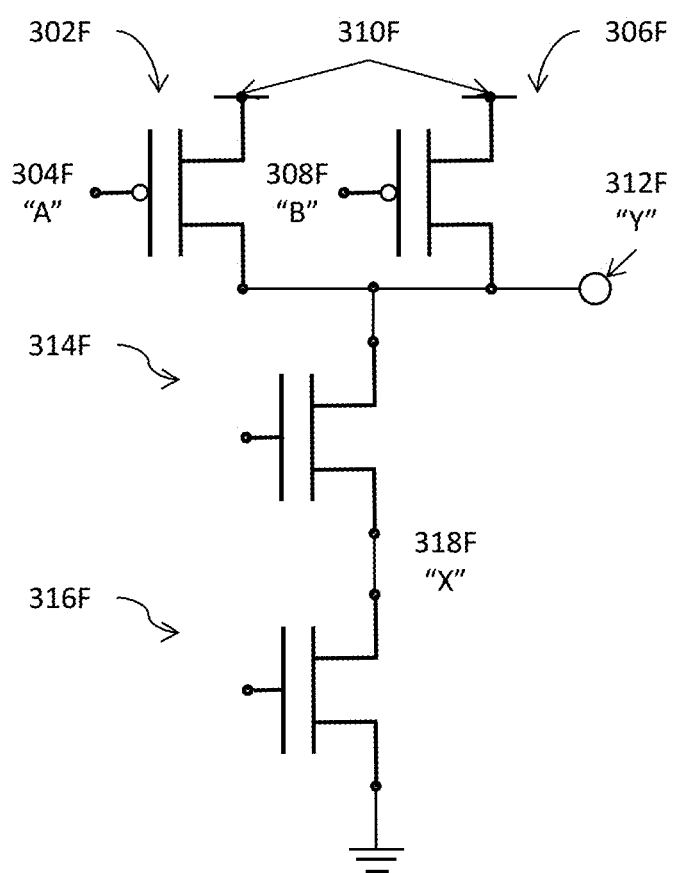
FIG. 3F illustrates an example the application of transistor level satisfiability models in implementing a portion of an electronic design in some embodiments.

FIG. 3F illustrates an example the application of transistor level satisfiability models in implementing a portion of an electronic design in some embodiments. In this example, the drain terminals of MOS 302F (a PMOS having the gate terminal connected to wire "A" 304F) and MOS 306F (a PMOS having the gate terminal connected to wire "B" 308F) are connected to the voltage source (e.g., Vdd). The source terminals of MOS 302F and MOS 306F are connected together by wire "Y" 312F to which the drain terminal of MOS 314F (an NMOS) is connected. The source terminal of MOS 314F is connected to the drain terminal of MOS 316F (another NMOS) via wire "X" 318F; and the source terminal of MOS 316F is connected to the ground.

By applying the techniques described herein with the four wires 304F, 308F, 312F, and 318F, the following logic models may be derived:

$$\text{For } MOS\ 302F:(A+Y+1')(A+Y'+1)=(A+Y) \quad (29)$$

$$\text{For } MOS\ 306F:(B+Y+1')(B+Y'+1)=(B+Y) \quad (30)$$

$$\text{For } MOS\ 314F:(A'+X'+Y)(A'+X+Y') \quad (31)$$

$$\text{For } MOS316F:(B'+X+0')(B'+X'+0)=(B'+X) \quad (32)$$

The overall logic model may thus be represented as follows:

$$(A+Y)(B+Y)(A'+X'+Y)(A'+X+Y')(B'+X) \quad (33)$$

The overall logic model may be provided to an SAT solver module to determine satisfying assignments that satisfy this CNF formula and thus solve the satisfiability problem for the underlying electronic design. For example, with the additional constraints A=1 and Y=0, the SAT solver module may determine a satisfying assignment {A=1, B=1, X=0, Y=0} that evaluates the CNF formula to be true. As another example, with the additional constraints A=0 and Y=0, the SAT solver module may determine that no satisfying assignment exist to satisfy the aforementioned CNF formula because regardless of the values of B and X, no assignments exist for the CNF formula to be true.

Figure 3G:
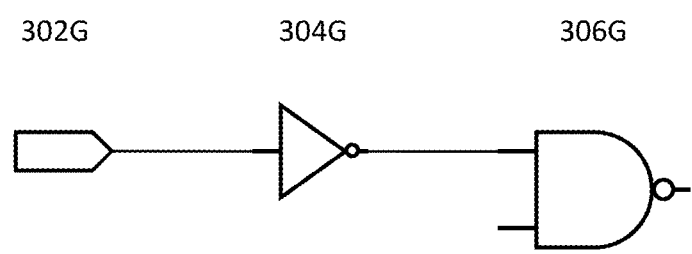
FIG. 3G illustrates another example the application of transistor level satisfiability models in implementing a portion of an electronic design in some embodiments.

FIG. 3G illustrates another example the application of transistor level satisfiability models in implementing a portion of an electronic design in some embodiments. More specifically, FIG. 3G illustrates the application of various techniques described herein for constant propagation that may be useful in sensitizing a timing arc inside a channel connected component, for example. As a practical example, a user may define or provide one or more values for input or constraints when sensitizing a timing arc. These values or constants may need to be propagated to sensitize the timing arc. In this example, the input 302G drives the inverter 304G whose output further drives one of the two inputs of a two-input NAND gate 306G. The two-input NAND gate 306G generate an output "0" when both inputs are "1" and an output "0" otherwise. Various techniques described herein may utilize transistor level SAT logic models described above for propagating these values or constants through the timing arc. For example, if a user provides an input value of "1" at the input 302G, various techniques may use logic SAT models described above to verify whether the output of the NAND gate 306G is "1".

Figure 4:
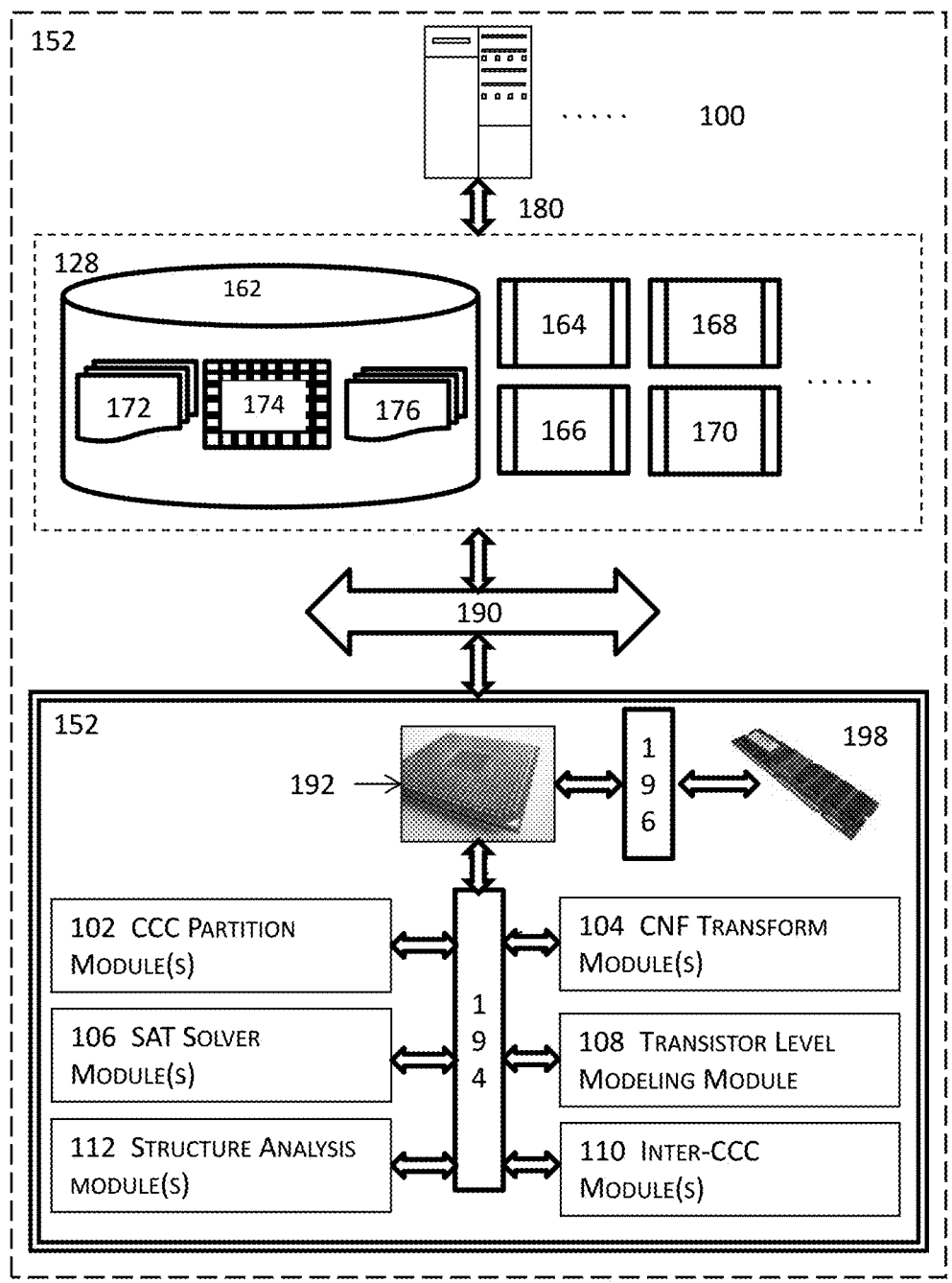
FIG. 4 illustrates an example of hardware system that may be used in implementing an electronic design with transistor level satisfiability models in some embodiments.

FIG. 4 illustrates a high level schematic block diagrams for implementing an electronic design with transistor level satisfiability models in one or more embodiments. More specifically, FIG. 4 illustrates an illustrative high level schematic block diagrams for implementing an electronic design with transistor level satisfiability models and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various SAT logic and state models, various conjunctive normal forms, various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of mechanisms 152 including hardware mechanisms and software modules or combinations of one or more hardware mechanisms and one or more software modules that may comprises one or more channel connected component (CCC) partition modules 102 to partition an electronic design (e.g., a netlist, a schematic design at one or more abstraction levels, etc.) The set of mechanisms 152 may also include one or more CCC transform modules 104 to transform satisfiability models into conjunctive normal forms. In some embodiments, the one or more CCC transform modules 104 include a Tseitin transform module that performs Tseitin transformations to convert SAT logic models and SAT state models into conjunctive normal forms.

The set of mechanisms 152 may further optionally include one or more SAT solver modules 106 that accept SAT models or conjunctive normal forms as inputs for satisfiability problems to determine satisfying assignments or switch vectors that render the satisfiability problems (e.g., in the form of CNF formulae) to be true and hence satisfy the satisfiability problems. In addition or in the alternative, the set of mechanisms 152 may include transistor level SAT modeling modules 108 to model and represent an individual circuit component or a block of multiple circuit components into corresponding transistor level SAT models, one or more inter-CCC modules 110 to various inter-CCC tasks such as constant propagation, constraining correlated inputs with SAT logic models of neighboring channel connected components, and one or more structural and functional analysis module 112 to perform various structural and functional analyses for electronic designs of interest.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more mechanisms in the set of mechanisms 152. One or more mechanisms in the set 152 may include or at least function in tandem with a microprocessor 192 via a computer bus 194 in some embodiments. In these embodiments, a single microprocessor 192 may be included in and thus shared among more than one mechanism even when the computing system 100 includes only one microprocessor 192. A microprocessor 192 may further access some non-transitory memory 198 (e.g., random access memory or RAM) via a system bus 196 to read and/or write data during the microprocessor's execution of processes.

System Architecture Overview

Figure 5:
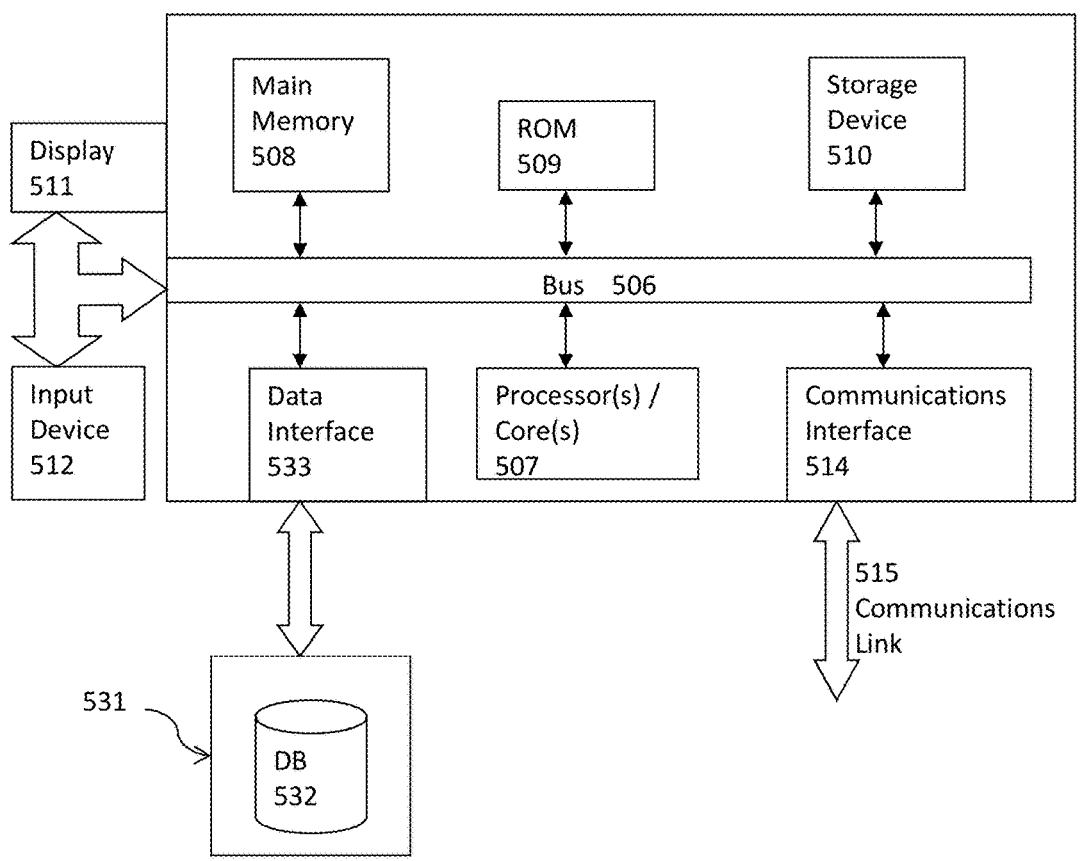
FIG. 5 illustrates a computerized system on which a method for implementing scalable statistical library characterization for electronic designs may be implemented.

FIG. 5 illustrates a block diagram of an illustrative computing system 500 suitable for implementing an electronic design with transistor level satisfiability models as described in the preceding paragraphs with reference to various figures. Computer system 500 includes a bus 506 or other communication mechanism for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

According to one embodiment, computer system 500 performs specific operations by one or more processor or processor cores 507 executing one or more sequences of one or more instructions contained in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program, i.e., application code, through communication link 515 and communication interface 514. Received program code may be executed by processor 507 as it is received, and/or stored in disk drive 510, or other non-volatile storage for later execution. In an embodiment, the computer system 500 operates in conjunction with a data storage system 531, e.g., a data storage system 531 that includes a database 532 readily accessible by the computer system 500. The computer system 500 communicates with the data storage system 531 through a data interface 533. A data interface 533, which is coupled to the bus 506, transmits and receives electrical, electromagnetic or optical signals that include data streams representing various types of signal information, e.g., instructions, messages and data. In embodiments of the invention, the functions of the data interface 533 may be performed by the communication interface 514.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic design with transistor level satisfiability models, comprising:
   performing a process for sensitizing an electronic design by at least one microprocessor or at least one processor core executing one or more threads of execution of one or more computing systems, the process comprising:
      determining a transistor level satisfiability (SAT) model for a channel connected component of a plurality of channel connected components in an electronic design at least by:
         integrating a set of pre-switch SAT models and a set of post-switch SAT models into the transistor level SAT model based at least in part upon a switching requirement of the channel connected component;
      transforming the plurality of channel connected components into a set of conjunctive normal form (CNF) formulae using at least the transistor level SAT model;
      generating a sensitized electronic design from the electronic design at least by sensitizing, at an SAT solver module stored at least in memory of at least one of the one or more computing systems and functioning in conjunction with the at least one microprocessor or the at least one processor core, the plurality of channel connected components of the electronic design with at least one or more satisfying assignments that are determined with the set of CNF formulae, without using reduced order binary decision diagrams; and
      creating or updating a layout based at least in part upon the sensitized electronic design.

2. The computer implemented method of claim 1, the process further comprising:
   partitioning, at a partition module stored at least partially in memory, the electronic design into the plurality of channel connected components.

3. The computer implemented method of claim 1, the process further comprising:
   identifying the plurality of channel connected components of the electronic design for sensitization;
   identifying a first channel connected component from the plurality of channel connected components of the electronic design;
   identifying at least one circuit component in the first channel connected component; and
   representing the at least one circuit component as one or more satisfiability models that are retrieved or derived from the set of satisfiability models.

4. The computer implemented method of claim 3, the process further comprising:
   identifying at least one wire connecting multiple circuit components in the first channel connected component;
   determining a transistor level SAT logic model for the at least one wire in the first channel connected component; and
   generating a wire state resolution SAT state model with the transistor level SAT logic model for the at least one wire.

5. The computer implemented method of claim 3, the process further comprising:
   identifying a loop topology comprising a plurality of circuit components in the first channel connected component; and
   representing the loop topology with at least two loop detection SAT state models that improve accuracy of sensitizing the first channel connected component.

6. The computer implemented method of claim 3, the process further comprising:
   identifying the switching requirement for a first circuit component in the channel connected component;
   identifying a set of pre-switch SAT models and a set of post-switch SAT models for the first circuit component; and
   integrating the set of pre-switch SAT models and the set of post-switch SAT models into an SAT switch model for the first circuit component.

7. The computer implemented method of claim 6, the process further comprising:
   determining one or more transistor level pre-switch SAT logic models for the first circuit component;
   identifying the one or more transistor level pre-switch SAT logic models into the SAT switch model for the first circuit component;
   determining one or more transistor level post-switch SAT logic models for the first circuit component;
   identifying the one or more transistor level post-switch SAT logic models into the SAT switch model for the first circuit component;
   determining one or more transistor level post-switch SAT state models for the first circuit component; and
   identifying the one or more transistor level post-switch SAT state models into the SAT switch model for the first circuit component.

8. The computer implemented method of claim 1, further comprising:
   identifying a block comprising multiple circuit components in the electronic design;
   determining one or more new variables reflecting one or more states or values of the electronic design; and
   performing a local transformation on the block to convert the block into at least one conjunctive normal form formula.

9. The computer implemented method of claim 8, the process further comprising:
   integrating the at least one conjunctive normal form formula for the block, a wire state resolution SAT state model, one or more satisfiability models representing a first circuit component in the plurality of channel connected components, at least two loop detection SAT state models, and an SAT switch model for a second circuit component in the plurality of channel connected components into the set of conjunctive normal form formulae.

10. A computer implemented method for implementing a transistor level satisfiability model, comprising:
   performing a process for sensitizing an electronic design by at least one microprocessor or at least one processor core executing one or more threads of execution of one or more computing systems, the process comprising:
      determining a transistor level satisfiability (SAT) model for a channel connected component of a plurality of channel connected components of an electronic design at least by:
         integrating a set of pre-switch SAT models and a set of post-switch SAT models into the transistor level SAT model based at least in part upon a switching requirement of the channel connected component;

transforming the plurality of channel connected components into a set of conjunctive normal form (CNF) formulae using at least the transistor level SAT model;

generating a sensitized electronic design from the electronic design at least by sensitizing, at a SAT solver module stored at least in memory of at least one of the one or more computing systems and functioning in conjunction with the at least one microprocessor or the at least one processor core, the plurality of channel connected components of the electronic design with at least one or more satisfying assignments that are determined with the set of CNF formulae, without using reduced order binary decision diagrams; and updating a physical layout.

11. The computer implemented method of claim 10, the process further comprising:

identifying a plurality of logic variables for a plurality of wires;

determining a plurality of transistor level SAT wire logic models with the plurality of logic variables for the plurality of wires; and representing the plurality of wires with the plurality of transistor level SAT wire logic models.

12. The computer implemented method of claim 11, the process further comprising:

identifying a directionality variable for the channel connected component;

identifying a plurality of state variables for a plurality of terminals of the channel connected component;

determining one or more transistor level SAT state models with the directionality variable and the plurality of state variables based in part or in whole upon design specifications and one or more characteristics of the channel connected component in the electronic design; and representing the circuit component with the plurality of transistor level SAT wire logic models and the one or more transistor level SAT state models.

13. The computer implemented method of claim 12, the process further comprising:

identifying a switching constraint for the channel connected component;

determining one or more pre-switch SAT logic models for the channel connected component;

determining one or more post-switch SAT logic models for the channel connected component;

determining one or more post-switch SAT state models for the channel connected component; and constructing a transistor level SAT switch model for the channel connected component at least by integrating the one or more pre-switch SAT logic models, the one or more post-switch SAT logic models, and the one or more post-switch SAT state models for the circuit component.

14. The computer implemented method of claim 13, the process further comprising:

transforming the transistor level SAT switch model into the set of conjunctive normal (CNF) form formulae; and generating, at an SAT solver module stored at least partially in memory, one or more switch vectors for the channel connected component at least by determining one or more satisfying assignments that satisfy the set of CNF formulae.

15. A system for implementing an electronic design with transistor level satisfiability models, comprising:

memory storing thereupon compiled program code on one or more computing systems; and at least one processor or at least one processor core that executes a sequence of instructions for the compiled program code in the memory for sensitizing an electronic design at least to:

determine a transistor level satisfiability (SAT) model for a channel connected component of a plurality of channel connected components in an electronic design at least by integrating a set of pre-switch SAT models and a set of post-switch SAT models into the transistor level SAT model based at least in part upon a switching requirement of the channel connected component;

reduce memory footprint and runtime of sensitizing an electronic design on one or more computing systems at least by transforming the plurality of channel connected components into a set of conjunctive normal form (CNF) formulae using at least the transistor level SAT model; and generate a sensitized electronic design from the electronic design at least by sensitizing, at a SAT solver module stored at least in memory of at least one of the one or more computing systems and functioning in conjunction with the at least one microprocessor or the at least one processor core, the plurality of channel connected components of the electronic design with at least one or more satisfying assignments that are determined with the set of CNF formulae, without using reduced order binary decision diagrams.

16. The system of claim 15, wherein the at least one processor or at least one processor core is further to:

identify the channel connected component from a plurality of channel connected components of the electronic design;

identify at least one circuit component in the channel connected component; and represent the at least one circuit component as one or more satisfiability models that are retrieved or derived from the set of satisfiability models.

17. The system of claim 16, wherein the at least one processor or at least one processor core is further to:

identify at least one wire connecting multiple circuit components in the channel connected component;

determine a transistor level SAT logic model for the at least one wire in the channel connected component; and generate a wire state resolution SAT state model for the at least one wire.

18. The system of claim 16, wherein the at least one processor or at least one processor core is further to:

identify a loop topology comprising a plurality of circuit components in the channel connected component; and represent the loop topology with at least two loop detection SAT state models that improve accuracy of sensitizing the channel connected component.

19. The system of claim 16, wherein the at least one processor or at least one processor core is further to:

identify a switching requirement for a first circuit component in the channel connected component;

identify a first set of pre-switch SAT models and a first set of post-switch SAT models for the first circuit component; and integrate the first set of pre-switch SAT models and the first set of post-switch SAT models into an SAT switch model for the first circuit component.

20. The system of claim 19, wherein the at least one processor or at least one processor core is further to:
- determine one or more transistor level pre-switch SAT logic models for the first circuit component;
- identify the one or more transistor level pre-switch SAT logic models into the SAT switch model for the first circuit component;
- determine one or more transistor level post-switch SAT logic models for the first circuit component;
- identify the one or more transistor level post-switch SAT logic models into the SAT switch model for the first circuit component;
- determine one or more transistor level post-switch SAT state models for the first circuit component; and
- identify the one or more transistor level post-switch SAT state models into the SAT switch model for the first circuit component.

* * * * *